US012754239B2

(12) United States Patent
Saito et al.

(10) Patent No.: US 12,754,239 B2
(45) Date of Patent: Oct. 6, 2026

(54) CHARGE/DISCHARGE INSPECTION DEVICE AND CHARGE/DISCHARGE INSPECTION EQUIPMENT

(71) Applicant: NIPPON STEEL TEXENG. CO., LTD., Tokyo (JP)

(72) Inventors: Shigeru Saito, Tokyo (JP); Yuuki Kimura, Tokyo (JP); Toshiharu Karino, Tokyo (JP); Hiroki Tawa, Tokyo (JP); Kyousuke Matsumoto, Tokyo (JP); Takayuki Ueno, Tokyo (JP); Shinji Kihara, Tokyo (JP); Tomoki Haraguchi, Tokyo (JP); Teruhito Ishibashi, Tokyo (JP)

(73) Assignee: NIPPON STEEL TEXENG. CO., LTD., Tokyo (JP)

( * ) Notice: Subject to any disclaimer, the term of this patent is extended or adjusted under 35 U.S.C. 154(b) by 124 days.

(21) Appl. No.: 18/979,745

(22) Filed: Dec. 13, 2024

(65) Prior Publication Data

US 2025/0110177 A1 Apr. 3, 2025

Related U.S. Application Data

(63) Continuation of application No. PCT/JP2023/027738, filed on Jul. 28, 2023.

(30) Foreign Application Priority Data

Jun. 15, 2022 (JP) ................................ 2022-096150

(51) Int. Cl.
*G01R 31/36* (2020.01)
*G01R 1/073* (2006.01)
(Continued)

(52) U.S. Cl.
CPC ..... *G01R 31/3644* (2013.01); *G01R 1/07357* (2013.01); *G01R 31/3835* (2019.01);
(Continued)

(58) Field of Classification Search
CPC .......................... Y02E 60/10; G01R 31/3644; G01R 1/07357; G01R 31/3835; G01R 31/388; H01M 10/4285; H02J 7/50; H02J 7/751
See application file for complete search history.

(56) References Cited

U.S. PATENT DOCUMENTS

2002/0190693 A1* 12/2002 Kitagawa ......... G01R 19/16542 320/132
2010/0085012 A1* 4/2010 Cruise ................ H01M 10/441 320/155
(Continued)

FOREIGN PATENT DOCUMENTS

CN 108011419 A 5/2018
CN 208896889 U 5/2019
(Continued)

OTHER PUBLICATIONS

International Search Report issued in PCT/JP2023/027738 mailed on Sep. 12, 2023 with English Translation (7 pages).
(Continued)

*Primary Examiner* — Paresh Patel
(74) *Attorney, Agent, or Firm* — Nakanishi IP Associates, LLC

(57) ABSTRACT

Provided is a charge/discharge inspection device that includes: a probe unit having a base board; a plurality of power supply boards inserted into the base board and used integrally with the probe unit; and a plurality of probes electrically connected to the power supply boards and provided on the probe unit, wherein the power supply boards comprise control means for performing control for charge/
(Continued)

discharge inspection, and the base board includes cooling means for cooling the power supply boards.

6 Claims, 5 Drawing Sheets

(51) Int. Cl.

| | |
|---|---|
| ***G01R 31/3835*** | (2019.01) |
| ***G01R 31/388*** | (2019.01) |
| ***H01M 10/42*** | (2006.01) |
| ***H02J 7/50*** | (2026.01) |
| ***H02J 7/70*** | (2026.01) |

(52) U.S. Cl.

CPC ...... *G01R 31/388* (2019.01); *H01M 10/4285* (2013.01); *H02J 7/50* (2026.01); *H02J 7/751* (2026.01)

(56) References Cited

U.S. PATENT DOCUMENTS

| | | | | |
|---|---|---|---|---|
| 2016/0094056 | A1* | 3/2016 | Dulle | B60L 3/0046 320/126 |
| 2021/0226472 | A1* | 7/2021 | Lee | H01M 10/44 |
| 2024/0219474 | A1* | 7/2024 | Li | G01R 31/387 |
| 2026/0140185 | A1* | 5/2026 | Haraguchi | G01R 31/3644 |

FOREIGN PATENT DOCUMENTS

| | | | |
|---|---|---|---|
| JP | S62-89431 | A | 4/1987 |
| JP | 2001-305158 | A | 10/2001 |
| JP | 2007-85916 | A | 4/2007 |
| JP | 2012-244742 | A | 12/2012 |
| JP | 2013-149440 | A | 8/2013 |
| JP | 2014-163725 | A | 9/2014 |
| JP | 2014-163743 | A | 9/2014 |
| JP | 2014-174049 | A | 9/2014 |
| JP | 5695970 | B2 | 4/2015 |
| JP | 5832450 | B2 | 12/2015 |
| JP | 5891042 | B2 | 3/2016 |
| JP | 2016-77941 | A | 5/2016 |
| JP | 6055806 | B2 | 12/2016 |
| JP | 6144074 | B2 | 6/2017 |
| JP | 2019-91622 | A | 6/2019 |
| JP | 6841457 | B1 | 3/2021 |
| JP | 2021-105557 | A | 7/2021 |
| JP | 2021-190159 | A | 12/2021 |
| WO | 2012/093652 | A1 | 6/2014 |

OTHER PUBLICATIONS

Written Opinion of International Searching Authority issued in PCT/JP2023/027738 mailed on Sep. 12, 2023 with English Translation (8 pages).

* cited by examiner

CHARGE/DISCHARGE INSPECTION DEVICE AND CHARGE/DISCHARGE INSPECTION EQUIPMENT

CROSS-REFERENCE TO RELATED APPLICATIONS

This application is a Continuation Application of PCT application No. PCT/JP2023/027738 filed on Jul. 28, 2023, which is based upon and claims priority to Japanese Patent Application No. JP2022-096150 filed on Jun. 15, 2022, the disclosures of which are incorporated by reference.

TECHNICAL FIELD

The present invention relates to a charge/discharge inspection device used in charge/discharge inspection and to charge/discharge inspection equipment comprising this charge/discharge inspection device.

BACKGROUND ART

In recent years, in charge/discharge inspection, the increase in charge/discharge current, the sophistication of charge/discharge inspection devices, and the like due to the increase in the capacity of secondary batteries to be inspected have been advancing. In addition, along with this, techniques for realizing more efficient charge/discharge inspection have been studied.

For example, Patent Literature 1 describes a charge/discharge power supply device for the purpose of being capable of reducing the loss of output voltage by minimizing impedance between a power supply and a battery on the premise of using a more highly integrated converter. This charge/discharge power supply device is characterized in that a battery tray and a plurality of highly integrated converters are integrated and a highly integrated converter assembly consisting of the highly integrated converters can be freely attached to and detached from the battery tray.

Further, Patent Literature 2 describes a charge/discharge device for a secondary battery for the purpose of realizing good acquisition of inspection results by making a power supply unit and a contact unit independent of each other and making it possible to switch whether to make an electrical connection or not without using a cable. This charge/discharge device for a secondary battery comprises: a power supply unit; a secondary battery unit that houses a plurality of secondary batteries; and a contact unit that is provided independently of the power supply unit and the secondary battery unit and electrically connects the power supply unit and each secondary battery during use, wherein it is possible to switch whether to electrically connect the power supply unit and the contact unit or not depending on distance between the power supply unit and the contact unit.

Further, Patent Literature 3 describes a charge/discharge inspection system for the purpose of being capable of reducing a load on a conveying device when a probe unit is replaced. This charge/discharge inspection system comprises: a charge/discharge inspection device for charging/discharging a secondary battery for inspection; a conveying device that conveys the secondary battery to the charge/discharge inspection device; and an attachment/detachment unit that attaches/detaches a probe unit. Note that the attachment/detachment unit comprises: a moving mechanism that moves the probe unit to attach/detach it to/from a inspection unit; and reaction force transmission means for transmitting reaction force generated at the time of attachment/detachment to a receiving part of the inspection unit.

Besides the above, with respect to charge/discharge inspection equipment that performs maintenance and the like of a charge/discharge inspection device, some pieces of charge/discharge inspection equipment are described in Patent Literatures 4 to 6.

For example, Patent Literature 4 describes charge/discharge inspection equipment for the purpose of enabling reduction in size and improvement of maintainability. This charge/discharge inspection equipment is charge/discharge inspection equipment for a battery, comprising a charge/discharge inspection device that performs charge/discharge inspection by bringing electrode contactors connected to a charge/discharge inspection apparatus into contact with electrodes of a battery in a battery tray and energizing it, wherein the charge/discharge inspection device includes: a charge/discharge inspection unit including an elevation member that holds the electrode contactors and presses the electrode contactors from above against the electrodes of the battery, and a battery-side terminal part that is provided on the elevation member and having terminals A connected to the respective electrode contactors; and a charge/discharge stage that accommodates the charge/discharge inspection unit and includes an inspection apparatus-side terminal part having terminals B each connected to the charge/discharge inspection apparatus, and the charge/discharge stage and the charge/discharge inspection unit are provided with a positioning mechanism that guides connection between the terminals A and the terminals B.

Further, Patent Literature 5 describes a charge/discharge inspection system, and a calibration system and a calibration device for a charge/discharge inspection device, and Patent Literature 6 describes a probe cleaning device for a charge/discharge inspection device.

CITATION LIST

Patent Literature

Patent Literature 1: Japanese Patent No. 5695970
Patent Literature 2: Japanese Patent No. 6841457
Patent Literature 3: Japanese Patent No. 6144074
Patent Literature 4: Japanese Patent No. 5891042
Patent Literature 5: Japanese Patent No. 5832450
Patent Literature 6: Japanese Patent No. 6055806

SUMMARY OF INVENTION

Technical Problem

However, although the charge/discharge power supply device described in Patent Literature 1 has a configuration using a highly integrated converter assembly consisting of highly integrated converters, it has no cooling function, and therefore, now that the charge/discharge current has been increasing, there is a risk that the heat generation of the device increases during use.

Further, the charge/discharge device for a secondary battery described in Patent Literature 2 and the charge/discharge inspection system described in Patent Literature 3 have a risk of causing an increase in cost and making maintenance more difficult due to the large number of types of wires and the complexity of the mechanism (e.g., FIGS. 1 and 2 in Patent Literature 2 and FIG. 1 in Patent Literature 3).

Note that for the inventions described in Patent Literatures 4 to 6, equipment capable of responding to the above problems is required.

Therefore, an object of the present invention is to provide a charge/discharge inspection device and charge/discharge inspection equipment capable of realizing more efficient charge/discharge inspection even though the increase in charge/discharge current, the sophistication of charge/discharge inspection devices and the like have been advancing.

Solution to Problem

A charge/discharge inspection device of the present invention comprises: a probe unit having a base board; a plurality of power supply boards inserted into the base board and used integrally with the probe unit; and a plurality of probes electrically connected to the power supply boards and provided on the probe unit, wherein the power supply boards comprise control means for performing control for charge/discharge inspection, and the base board comprises cooling means for cooling the power supply boards.

Thereby, while the base board and the power supply boards are integrally used with the probe unit, power is supplied by the control means from the power supply boards to the probes to perform charge/discharge inspection, and heat generation of the power supply boards is suppressed by the cooling means.

In particular, it is desirable that the base board and the power supply boards are separate parts, and a type of the base board or/and the number of the power supply boards are selected according to a type or/and the number of at least one secondary battery to be inspected, and the base board and the power supply boards are integrally used with the probe unit.

Thereby, the type of the base board or the number of inserted power supply boards can be changed according to the type or capacity of a secondary battery to be inspected.

Further, the charge/discharge inspection device desirably comprises an elastic part that is provided on the probe unit, is provided between the probe unit and each of a positive electrode and a negative electrode of the plurality of probes, and deforms in response to force in a direction in which the at least one secondary battery is attached to the probe unit.

Thereby, the force generated when the electrodes of the secondary battery contact the electrodes of the probe of the probe unit is received by the probe unit via the elastic part.

Further, it is desirable that the power supply boards comprise first voltage monitoring means for monitoring voltage of a secondary battery to be inspected, and the base board comprises second voltage monitoring means for monitoring voltage of the secondary battery, and power supply stop means for stopping operation of the power supply boards.

Thereby, it is possible to monitor the abnormality of the voltage of the secondary battery on the power supply board side using the first voltage monitoring means and further monitor the abnormality of the voltage of the secondary battery on the base board side using the second voltage monitoring means. Then, if an abnormality is detected in the voltage of the secondary battery, the operation of the power supply boards can be stopped by the power supply stop means.

Further, the charge/discharge inspection device desirably comprises: a terminal block provided with the probes, and slidable in a direction in which the probes are arranged; and a flexible wire that is provided in the probe unit, and electrically connects the power supply boards and the terminal block.

Thereby, the probes can freely slidably move in the direction in which they are arranged, that is, the direction toward each other and the direction away from each other.

On the other hand, charge/discharge inspection equipment comprises: the charge/discharge inspection device described above; and a diagnostic device that is capable of storing the charge/discharge inspection device, and comprises diagnostic means for diagnosing one or more of presence or absence of dirt or wear of the charge/discharge inspection device, or normality of the power supply boards, the cooling means, the first voltage monitoring means, the second voltage monitoring means, and the power supply stop means.

Furthermore, the charge/discharge inspection equipment desirably comprises a maintenance device that is capable of storing the charge/discharge inspection device, and comprises maintenance means for performing one or more of removal of dirt or replacement of a worn part of the charge/discharge inspection device, or calibration of the power supply boards, the cooling means, the first voltage monitoring means, the second voltage monitoring means, and the power supply stop means. With such charge/discharge inspection equipment, it is possible to diagnose the charge/discharge inspection device using the diagnostic device, and to perform maintenance of the charge/discharge inspection device using the maintenance device.

Advantageous Effects of Invention (1) With the configuration in which a charge/discharge inspection device of the present invention comprises: a probe unit having a base board; a plurality of power supply boards inserted into the base board and used integrally with the probe unit; and a plurality of probes electrically connected to the power supply boards and provided on the probe unit, wherein the power supply boards comprise control means for performing control for charge/discharge inspection, and the base board comprises cooling means for cooling the power supply boards, while the base board and the power supply boards are integrally used with the probe unit, power is supplied by the control means from the power supply boards to the probes to perform charge/discharge inspection, and heat generation of the power supply boards is suppressed by the cooling means, so that even though the increase in charge/discharge current has been advancing, it is possible to reduce the risk on charge/discharge inspection, such as occurrence of a fault or failure.

(2) In particular, with the configuration in which the base board and the power supply boards are separate parts, and a type of the base board or/and the number of the power supply boards are selected according to a type or/and the number of at least one secondary battery to be inspected, and the base board and the power supply boards are integrally used with the probe unit, the type of the base board or the number of inserted power supply boards can be changed according to the type or capacity of a secondary battery to be inspected, and therefore it is possible to realize highly scalable equipment design according to the specifications of the equipment.

(3) Further, with the configuration in which the charge/discharge inspection device comprises an elastic part that is provided on the probe unit, is provided between the probe unit and each of a positive electrode and a negative electrode of the plurality of probes, and deforms in response to force in a direction in which the at least one secondary battery is attached to the probe unit, the force generated when the electrodes of the secondary battery contact the electrodes of the probe of the probe unit is received by the probe unit via the elastic part, so that the power supply boards and the like are not subject to external force, and the risk of occurrence of a fault or trouble can be suppressed.

(4) Further, with the configuration in which the power supply boards comprise first voltage monitoring means for monitoring voltage of a secondary battery to be inspected, and the base board comprises second voltage monitoring means for monitoring voltage of the secondary battery, and power supply stop means for stopping operation of the power supply boards, it is possible to monitor the abnormality of the voltage of the secondary battery on the power supply board side using the first voltage monitoring means and further monitor the abnormality of the voltage of the secondary battery on the base board side using the second voltage monitoring means. Then, if an abnormality is detected in the voltage of the secondary battery, the operation of the power supply boards can be stopped by the power supply stop means, and therefore an external (upper-level) system such as a personal computer or a controller does not need to intervene even if an abnormality is detected, so that the external connection wiring can be simplified (omitted).

(5) Further, with the configuration in which the charge/discharge inspection device comprises: a terminal block provided with the probes, and slidable in a direction in which the probes are arranged; and a flexible wire that is provided in the probe unit, and electrically connects the power supply boards and the terminal block, the probes can freely slidably move in the direction in which they are arranged, that is, the direction toward each other and the direction away from each other, and therefore it is possible to prevent secondary batteries from swelling to contact each other during charge/discharge inspection, for example.

(6) Note that according to the charge/discharge inspection equipment described above, it is possible to diagnose the charge/discharge inspection device using the diagnostic device, and to perform maintenance of the charge/discharge inspection device using the maintenance device, so that the efficiency of charge/discharge inspection can further be improved.

DESCRIPTION OF EMBODIMENTS

Embodiments of the present invention will be described below in detail, but the description of the constituent features described below shows examples (representative examples) of embodiments of the present invention, and the present invention is not limited to the following content unless the spirit thereof is changed.

[Charge/Discharge Inspection Device]

Figure 1:
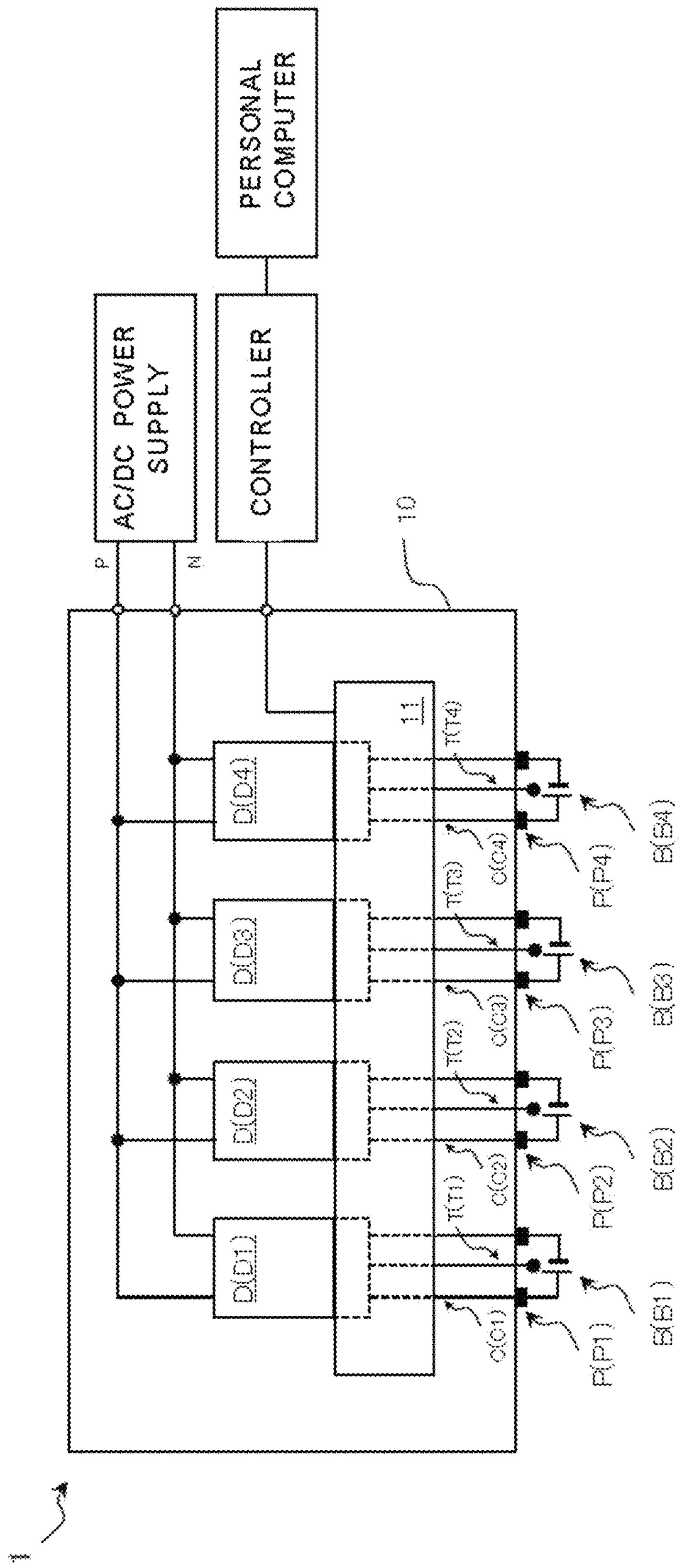
FIG. 1 is a schematic configuration diagram showing a charge/discharge inspection device according to an embodiment of the present invention.

FIG. 1 is a schematic configuration diagram showing a charge/discharge inspection device according to an embodiment of the present invention. A charge/discharge inspection device 1 includes: a probe unit 10 having a base board 11; a plurality of power supply boards D inserted into the base board 11 and used integrally with the probe unit 10; and a plurality of probes P electrically connected to the power supply boards D and provided on the probe unit 10.

The power supply boards D are insertable into, attachable to, and detachable from the base board 11. Therefore, the number of power supply boards D to be inserted can be increased or decreased according to the capacity of a secondary battery B to be inspected. In this embodiment, four power supply boards D (power supply boards D1 to D4) are inserted into the base board 11. Note that the power supply boards D are supplied with power from an AC/DC power supply connected to the probe unit 10.

In particular, it is desirable that the base board 11 and the power supply boards D are separate parts. As a result, the number of power supply boards D can be selected according to the types or/and number of secondary batteries B to be inspected. For example, the current value can be increased by preparing a plurality of power supply boards D. That is, the current value that can be supplied in charge/discharge inspection can be adjusted (increased or decreased) according to the types and number of secondary batteries B to be inspected.

Further, at the same time, the type of the base board 11 can be selected according to the types or/and number of secondary batteries B to be inspected. For example, from among base boards for which the numbers of accommodatable (insertable) power supply boards D are different from each other, the most appropriate one can be selected according to the specifications of the equipment.

Additionally, one secondary battery B can be inspected using a plurality of power supply boards D. Specifically, inspection can be performed by regarding a plurality of (e.g., two) power supply boards D as one power supply. Further, inspection can be performed by physically combining one control means D111 described later (see FIG. 3) and a plurality of (e.g., two) power supply boards D to form one power supply.

As described above, since the base board 11 and the power supply boards D are separate parts, highly scalable equipment design can be realized.

Further, the probes P contact the electrodes of a secondary battery B to supply power to the secondary battery B. In this embodiment, there are four secondary batteries B (secondary batteries B1 to B4), so four probes P (probes P1 to P4) are provided on the probe unit 10 as well. For these probes, not only a pin shape but also a clip shape or other shapes suitable for the secondary battery electrodes of the inspection device can be used as appropriate.

Note that a probe P is connected to a power supply board D via a cable C. For example, the probe P1 is connected to the power supply board D1 via a cable C1, and the power from the power supply board D1 is supplied to the secondary battery B1 via the cable C1 and the probe P1. The same applies to the probes P2 to P4.

Furthermore, the probe unit 10 includes a temperature probe T that measures the temperature of a secondary battery B. In this embodiment, temperature probes T1 to T4 are provided in the vicinity of the probes P1 to P4, respectively.

Figure 2:
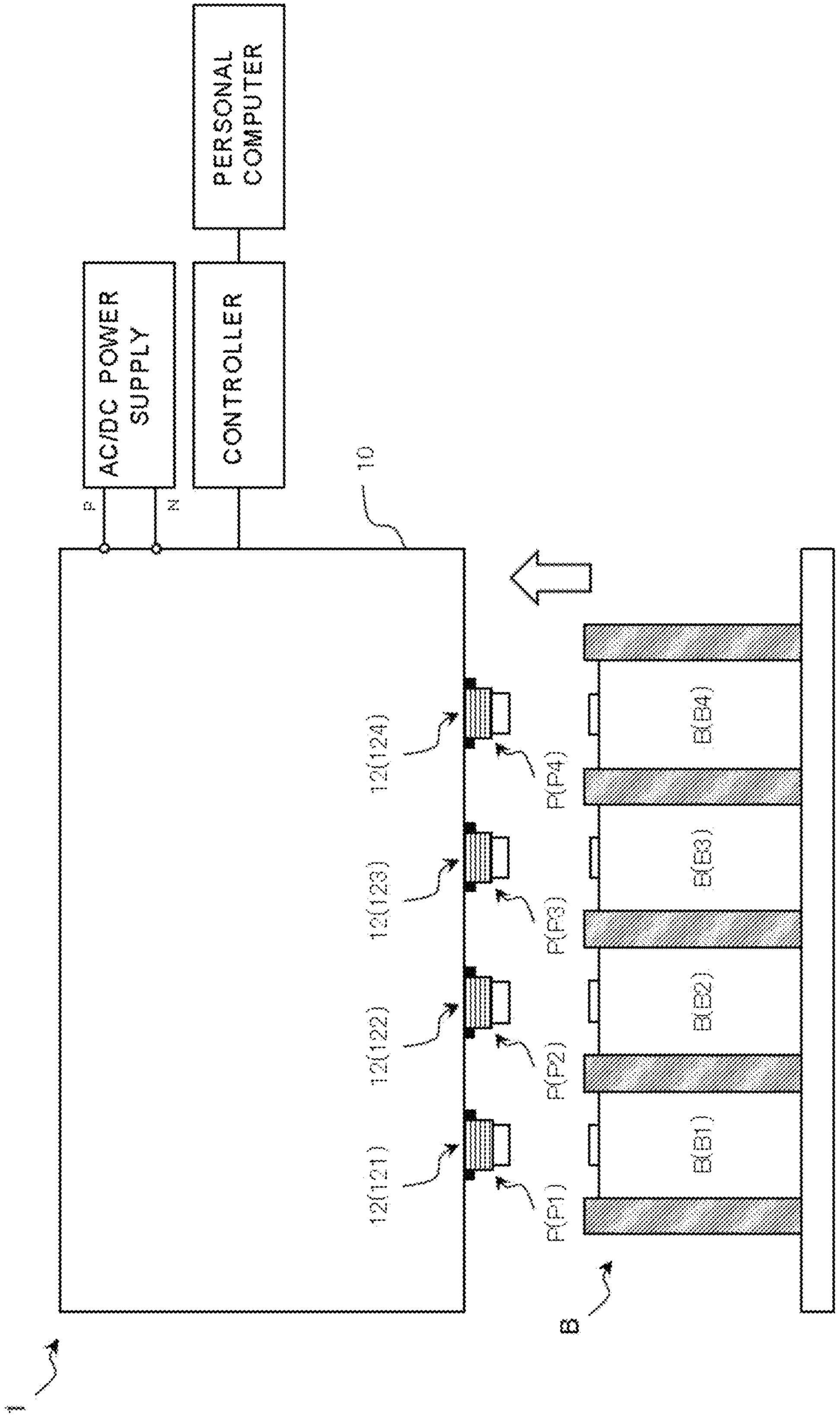
FIG. 2 is another schematic configuration diagram showing the charge/discharge inspection device according to the embodiment of the present invention.

FIG. 2 is another schematic configuration diagram showing the charge/discharge inspection device according to the embodiment of the present invention. Note that the same components as the components described using FIG. 1 are given the same reference numerals and the detailed description thereof is omitted.

As shown in FIG. 2, the probes P contact the electrodes (terminals) of the secondary batteries B. For example, the secondary batteries B move in the direction of the arrow shown in FIG. 2 to be attached to the probe unit 10. Of course, the probe unit 10 may be moved to be attached to the secondary batteries B.

At this time, when a large current occurs (when the charge/discharge current increases), then in order to reduce the contact resistance between the probes and the secondary batteries, high contact pressure is required between them. As a result, when the secondary batteries B are attached, there is a risk that the power supply boards D (see FIG. 1) inserted into the base board 11 of the probe unit 10 receive force.

Therefore, elastic parts 12 such as springs are preferably provided on the probe unit 10. As shown in FIG. 2, an elastic part 12 (121 to 124) is provided, for example, between the probe unit 10 and each of the positive electrode (not shown) and the negative electrode (not shown) of the probes P, and deforms in response to force in the direction in which a secondary battery B is attached to the probe unit 10.

That is, the force generated when the electrodes of a secondary battery B1 contact the electrodes of the probe P1 of the probe unit 10 is received by the probe unit 10 via the elastic part 121. Therefore, although the probe unit 10 is formed by integrally providing the power supply boards D and other important boards, circuits, and mechanisms that control advanced processing (e.g., control means D111 and cooling means 113 as described later) via the base board 11, the power supply boards D and the like are not subject to external force, so that the risk of a fault or trouble can be reduced.

[Base Board]

Figure 3:
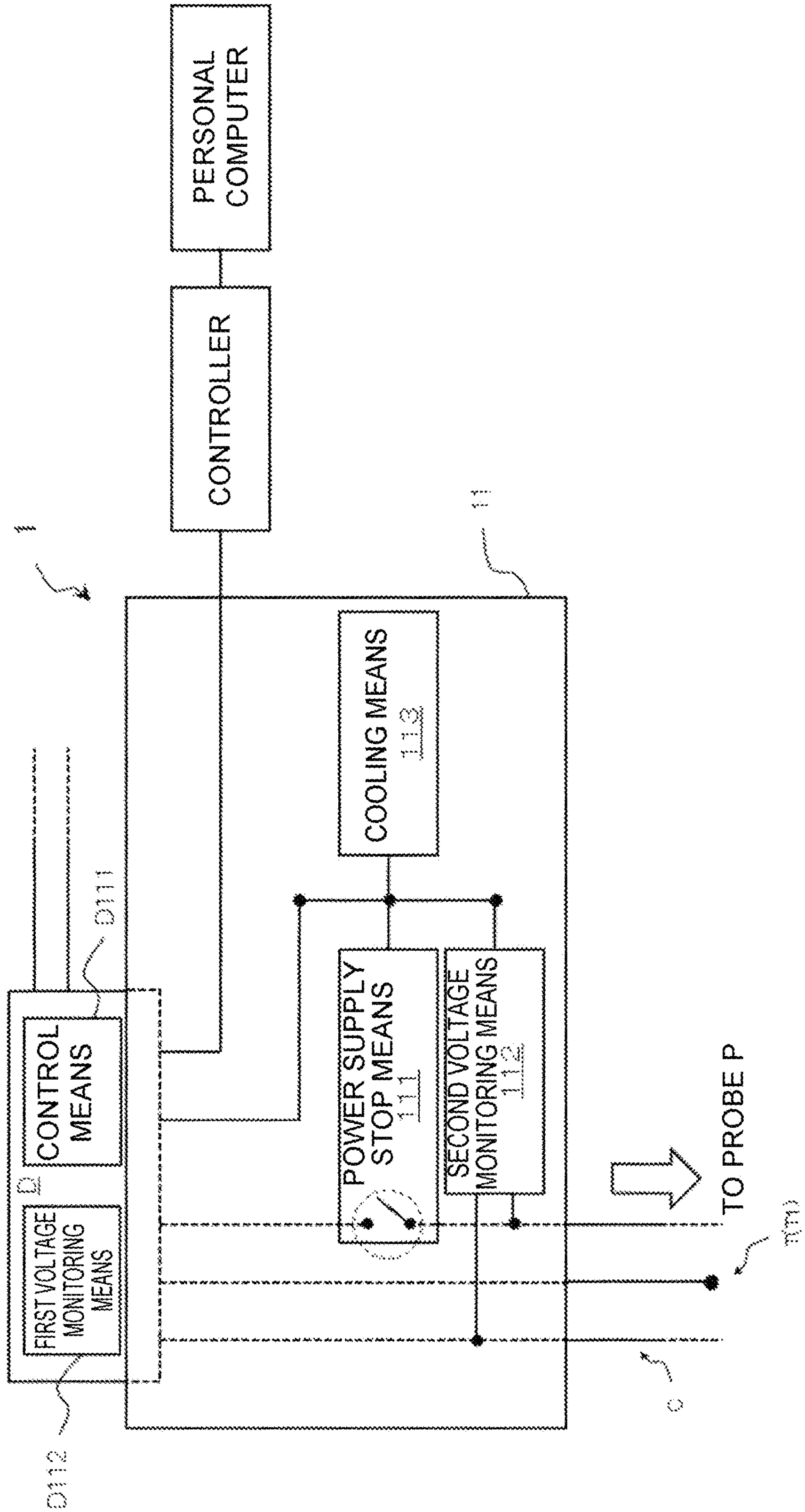
FIG. 3 is a schematic functional block diagram of a base board of the charge/discharge inspection device according to the embodiment of the present invention.

FIG. 3 is a schematic functional block diagram of the base board of the charge/discharge inspection device according to the embodiment of the present invention. In this embodiment, the base board 11 includes power supply stop means 111, second voltage monitoring means 112, and cooling means 113. On the other hand, the power supply board D includes control means D111 and first voltage monitoring means D112.

Further, the base board 11 is provided with a power line and a communication line. Therefore, this power line can be used to send power from the inserted power supply board D to the probe P and to supply power to boards that can implement these means. Furthermore, these means can communicate with each other using this communication line.

The control means D111 is means for bidirectionally communicating with an external personal computer via a controller. In addition, the control means D111 performs control for charge/discharge inspection, such as supplying or stopping power from the power supply board D to the probe P, according to an instruction from the personal computer.

Further, the cooling means 113 is means for cooling the power supply board D inserted into the base board 11. The cooling means 113 is, for example, a cooling fan.

The second voltage monitoring means 112 monitors the voltage of the secondary battery B. On the other hand, as described above, the power supply board D also has the first voltage monitoring means D112 that monitors the voltage of the secondary battery B.

Therefore, for example, the control means D111 collects the monitoring result from the first voltage monitoring means D112 and the monitoring result from the second voltage monitoring means 112, and if either one of the monitoring results is abnormal, the control means D111 can notify that effect. Notifying that effect means, for example, displaying an image indicating that effect on the personal computer by communication, playing an emergency voice, or lighting a light emitting part (not shown) in red.

Note that in a case where an abnormality is detected in the voltage of the secondary battery B as described above, the power supply stop means 111 stops the operation of the power supply board D, that is, the supply of power to the secondary battery B.

For example, as an example of a specific configuration of the power supply stop means 111, a switch such as a relay is provided midway in the power line connecting the power supply board D and the probe P as shown in FIG. 3, and the switch is shut off when an abnormality is detected (the dotted line frame in FIG. 3), thereby making it possible to stop supplying power to the secondary battery.

By doing so, even when an abnormality is detected in the voltage of the secondary battery, there is no need for intervention of an external (upper-level) system such as a personal computer or a controller, and the external connection wiring can be simplified (omitted). Note that when a switch such as a relay is not provided, the same operational effects can also be obtained by, for example, using a configuration in which the control means D111 detects an abnormality to stop supplying power to the power supply board D. Further, by notifying the control means D111 of the power supply board D of abnormal information detected by the power supply stop means 111, it is also possible to notify an external (upper-level) system such as a personal computer using communication means of the power supply board D.

Note that the power supply board D is provided with a current wire for being supplied with power and a voltage wire for detecting voltage. Here, the first voltage monitoring means D112 can acquire information from the voltage wire. On the other hand, the second voltage monitoring means 112 can acquire information from both wires.

Here, in particular, it is desirable that the first voltage monitoring means D112 detects a voltage abnormality in the secondary battery based on information acquired from the voltage wire, and the second voltage monitoring means 112 detects a voltage abnormality in the secondary battery based on information obtained from the current wire. This makes it possible to more accurately detect abnormalities in the voltage of the secondary battery.

For example, when a contact failure on the pin of the voltage wire occurs, there is a risk that the abnormality (the contact failure) cannot be detected in a configuration in which both the first voltage monitoring means D112 and the second voltage monitoring means 112 detect a voltage abnormality in the secondary battery based on information acquired from the voltage wire.

Therefore, since the charge/discharge inspection device 1 can doubly monitor the voltage of the secondary battery B in this way, safety in charge/discharge inspection can be guaranteed even when a large current occurs (even when the charge/discharge current increases).

[Modification of Probe Unit]

Figure 4:
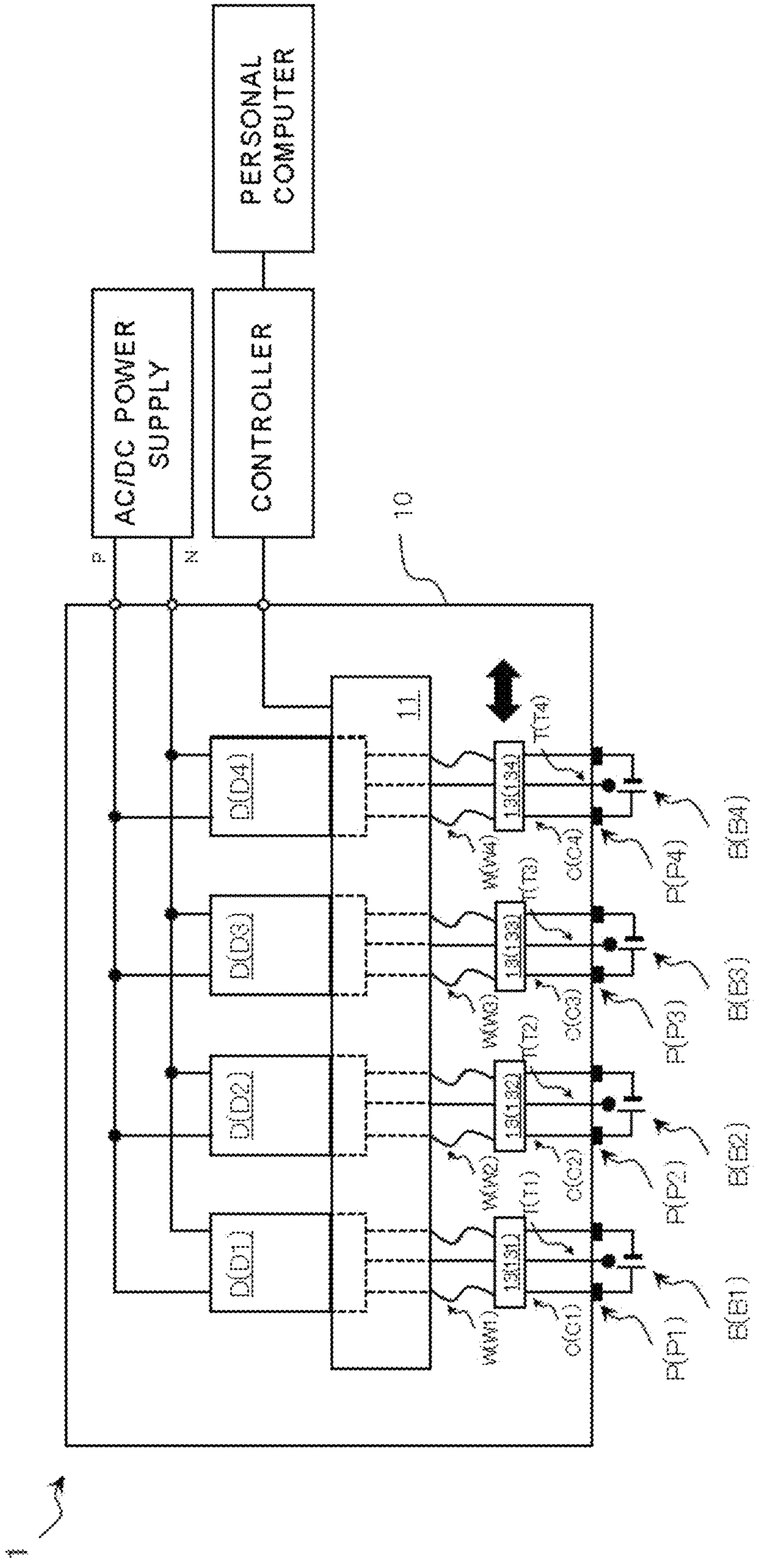
FIG. 4 is a schematic configuration diagram showing a charge/discharge inspection device according to another embodiment of the present invention.

FIG. 4 is a schematic configuration diagram showing a charge/discharge inspection device according to another embodiment of the present invention. As shown in FIG. 4, the probe unit 10 can be configured to include terminal blocks 13 (131 to 134) and flexible wires W (W1 to W4).

The terminal blocks 13 are provided with the probes P and are movable in the direction of the arrow shown in FIG. 4. Further, the terminal blocks 13 are connected to the power supply boards D by the wires W. That is, in this embodiment, the power from the power supply boards D (D1 to D4) is sent to the probes P (P1 to P4) via the wires W (W1 to W4) and the cables C (C1 to C4).

Here, the terminal block 13 is movable (e.g., slidable) in the direction of the arrow shown in FIG. 4, that is, in the direction in which the other terminal blocks are arranged. Therefore, the probes P provided for the terminal blocks 13 can also move in the direction.

As a result, the probes P1 to P4 can move in the direction toward each other or the direction away from each other, so even if a secondary battery B has swollen during charge/discharge inspection or there is an error in the thickness of a secondary battery B, it is possible to prevent secondary batteries B from contacting each other or prevent the probe unit 10 from being unable to be attached to the secondary battery B.

Note that, similarly, the temperature probe T may be configured to be connected from the terminal block 13 by the wire W.

[Charge/Discharge Inspection Equipment]

Figure 5:
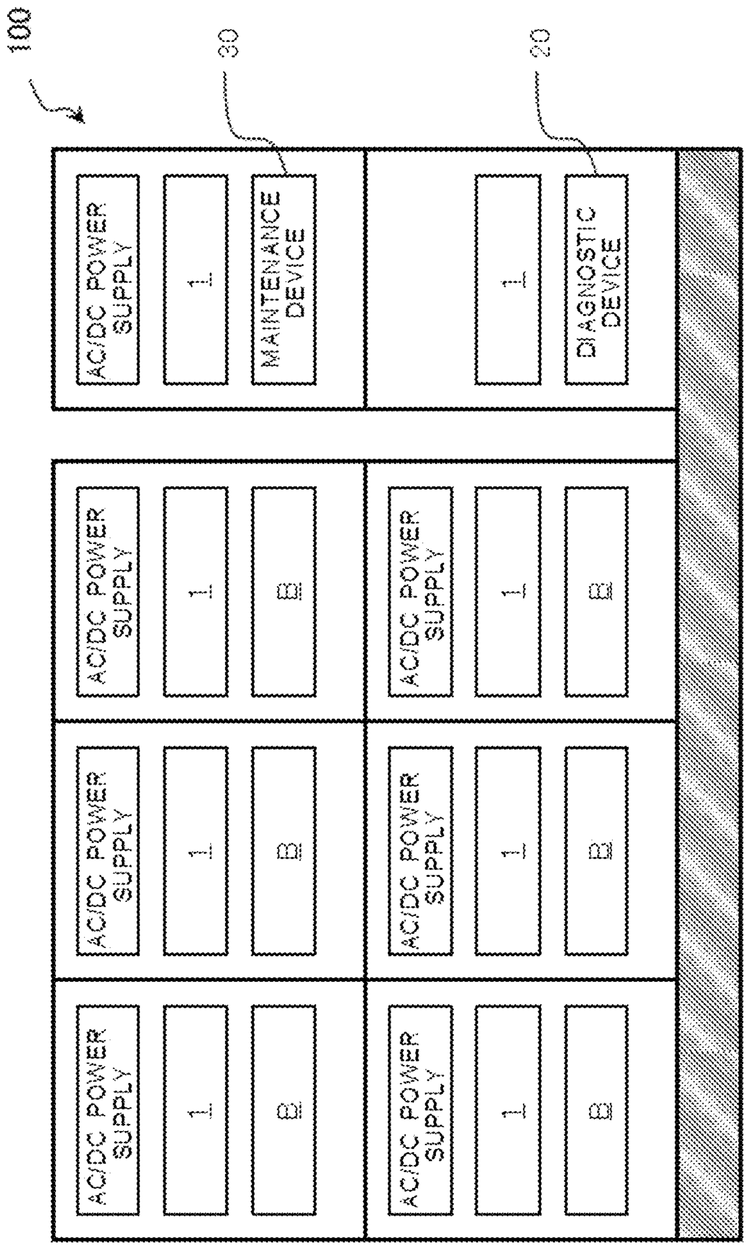
FIG. 5 is a schematic configuration diagram showing charge/discharge inspection equipment according to an embodiment of the present invention.

FIG. 5 is a schematic configuration diagram showing charge/discharge inspection equipment according to an embodiment of the present invention. As shown in FIG. 5, the charge/discharge inspection equipment 100 is provided with a plurality of places each in which a charge/discharge inspection device 1, an AC/DC power supply, and secondary batteries B to be inspected are stored, as described in FIG. 2. Note that the controller and the personal computer are connected to the charge/discharge inspection equipment 100, and can bidirectionally communicate with any charge/discharge inspection device 1.

Further, the charge/discharge inspection equipment 100 includes a diagnostic device 20 capable of storing a charge/discharge inspection device 1. In addition, the diagnostic device 20 has diagnostic means (not shown).

The diagnostic means can realize the following functions.

(1) Diagnosis of dirt of the stored charge/discharge inspection device. For example, detection of poor contact due to the adhesion of dust.

(2) Diagnosis of wear of the stored charge/discharge inspection device. For example, detection of probes deteriorated due to wear.

(3) Diagnosis of the normality of the power supply boards. For example, detection of deviation of the accuracy of voltage, current, and temperature.

(4) Diagnosis of the normality of the cooling means. For example, detection of a faulty cooling fan.

(5) Diagnosis of the normality of the first voltage monitoring means and the second voltage monitoring means. That is, it is diagnosed whether the double monitoring function is working normally.

(6) Diagnosis of the normality of the power supply stop means.

Furthermore, the charge/discharge inspection equipment 100 includes a maintenance device 30 capable of storing a charge/discharge inspection device 1. In addition, the maintenance device 30 has maintenance means (not shown).

The maintenance means can realize the following functions.

(1) Removal of dirt from the stored charge/discharge inspection device.

(2) Replacement of worn parts of the stored charge/discharge inspection device. For example, this also includes the replacement of a faulty cooling fan.

(3) Calibration of the power supply boards. For example, deviation of the accuracy of voltage, current, and temperature is calibrated.

(4) Calibration of the first voltage monitoring means and the second voltage monitoring means. For example, a degree of accuracy (a threshold value) at which the voltage of a secondary battery is determined to be abnormal is corrected.

(5) Calibration of the normality of the power supply stop means.

By configuring the charge/discharge inspection equipment 100 in this way, a charge/discharge inspection device 1 can for example be moved horizontally or vertically using a conveying device (to give an example, a stacker crane), and therefore it is possible to easily diagnose charge/discharge inspection devices 1 using the diagnostic device 20 and to immediately perform maintenance on one from which a problem has been detected in the diagnosis using the maintenance device 30.

Further, as described above, the charge/discharge inspection device 1 is an integration of the probe unit, the power supply, and the like. Therefore, it is possible to diagnose a charge/discharge inspection device 1 used for charge/discharge inspection immediately after detaching it from the secondary batteries B and to immediately replace a charge/discharge inspection device 1 in which a fault has occurred with a normal one, and therefore the impact of the charge/discharge inspection on the production tact can be minimized.

Additionally, since various functions as described above can be realized by the base board 11 included in the probe unit 1, it is possible to prevent the mechanism of the charge/discharge inspection device from becoming complex and resolve the increase in cost, the difficulty of maintenance, and the like.

The present embodiments described above are merely examples, and as long as the spirit of the present invention is not deviated from, the configurations of the probe unit 10, the charge/discharge inspection device 1, and the charge/discharge inspection equipment 100 can be changed in design as appropriate.

INDUSTRIAL APPLICABILITY

The present invention is useful in industry because it can be used as a charge/discharge inspection device and charge/discharge inspection equipment capable of realizing more efficient charge/discharge inspection.

REFERENCE SIGNS LIST

1 charge/discharge inspection device
10 probe unit
11 base board
111 power supply stop means
112 second voltage monitoring means
113 cooling means
12, 121, 122, 123, 124 elastic part
13, 131, 132, 133, 134 terminal block
20 diagnostic device
30 maintenance device
100 charge/discharge inspection equipment
D, D1, D2, D3, D4 power supply board
D111 control means
D112 first voltage monitoring means
C, C1, C2, C3, C4 cable
P, P1, P2, P3, P4 probe
T, T1, T2, T3, T4 temperature probe B, B1, B2, B3, B4 secondary battery
W, W1, W2, W3, W4 wire

The invention claimed is:

1. A charge/discharge inspection device comprising:

a probe unit having a base board;

a plurality of power supply boards inserted into the base board and used integrally with the probe unit; and a plurality of probes electrically connected to the power supply boards and provided on the probe unit, wherein the power supply boards comprise control means for performing control for charge/discharge inspection, and first voltage monitoring means for monitoring voltage of a secondary battery to be inspected, and the base board comprises second voltage monitoring means for monitoring voltage of the secondary battery, power supply stop means for stopping operation of the power supply boards, and cooling means for cooling the power supply boards.

2. The charge/discharge inspection device according to claim 1, wherein the base board and the power supply boards are separate parts, and a type of the base board or/and the number of the power supply boards are selected according to a type or/and the number of at least one secondary battery to be inspected, and the base board and the power supply boards are integrally used with the probe unit.

3. The charge/discharge inspection device according to claim 2, comprising an elastic part that is provided on the probe unit, is provided between the probe unit and each of a positive electrode and a negative electrode of the plurality of probes, and deforms in response to force in a direction in which the at least one secondary battery is attached to the probe unit.

4. The charge/discharge inspection device according to claim 2, comprising:

a terminal block provided with the probes, and slidable in a direction in which the probes are arranged; and a flexible wire that is provided in the probe unit, and electrically connects the power supply boards and the terminal block.

5. Charge/discharge inspection equipment comprising:

the charge/discharge inspection device according to claim 1; and a diagnostic device that is capable of storing the charge/discharge inspection device, and comprises diagnostic means for diagnosing one or more of presence or absence of dirt or wear of the charge/discharge inspection device, or normality of the power supply boards, the cooling means, the first voltage monitoring means, the second voltage monitoring means, and the power supply stop means.

6. The charge/discharge inspection equipment according to claim 5, comprising a maintenance device that is capable of storing the charge/discharge inspection device, and comprises maintenance means for performing one or more of removal of dirt or replacement of a worn part of the charge/discharge inspection device, or calibration of the power supply boards, the cooling means, the first voltage monitoring means, the second voltage monitoring means, and the power supply stop means.

* * * * *